United States Patent [19]

Pachschwöll

[11] Patent Number: 4,512,508
[45] Date of Patent: Apr. 23, 1985

[54] METHOD AND APPARATUS FOR THE MACHINE SOLDERING OF WORKPIECES

[75] Inventor: Heino Pachschwöll, Twistetal-Nieder-Waroldern, Fed. Rep. of Germany

[73] Assignee: Zevatron GmbH, Gesellschaft fur Fertigungseinrichtungen der Elektronik, Arolsen, Fed. Rep. of Germany

[21] Appl. No.: 360,955

[22] Filed: Mar. 23, 1982

[30] Foreign Application Priority Data

Mar. 25, 1981 [DE] Fed. Rep. of Germany ....... 3111809

[51] Int. Cl.³ ............................................ B23K 31/02
[52] U.S. Cl. .................................. 228/180.1; 228/37
[58] Field of Search ................. 228/180 R, 36, 38, 37; 118/416, 421, 423, 425

[56] References Cited

U.S. PATENT DOCUMENTS

| 2,671,264 | 3/1954 | Pessel . | |
|---|---|---|---|
| 3,218,193 | 11/1965 | Isaacson . | |
| 3,421,211 | 1/1969 | Eaves et al. | 228/37 |
| 3,499,220 | 3/1970 | Hintz et al. | 228/36 X |
| 3,500,536 | 3/1970 | Goldschmied | 228/37 |
| 3,536,243 | 10/1970 | Higgins | 228/37 |
| 3,670,698 | 6/1972 | Joosten | 118/425 |
| 3,765,591 | 10/1973 | Cook | 228/37 |
| 3,828,419 | 8/1974 | Wanner | 118/425 X |
| 4,277,518 | 7/1981 | Schillke et al. | 118/423 X |
| 4,311,266 | 1/1982 | Kondo | 228/180 R X |
| 4,331,279 | 5/1982 | Mincher et al. | 228/37 |
| 4,363,434 | 12/1982 | Flury | 228/180 A X |

FOREIGN PATENT DOCUMENTS

| 108706 | 10/1972 | German Democratic Rep. . |
| 801510 | 1/1955 | United Kingdom . |
| 846961 | 9/1960 | United Kingdom . |
| 1004225 | 9/1965 | United Kingdom . |
| 1058612 | 2/1967 | United Kingdom . |
| 1122913 | 8/1968 | United Kingdom . |
| 1158564 | 7/1969 | United Kingdom . |
| 1205127 | 9/1970 | United Kingdom . |
| 1358185 | 6/1974 | United Kingdom . |
| 1503216 | 3/1978 | United Kingdom . |
| 2069905 | 9/1981 | United Kingdom . |
| 2083773 | 3/1982 | United Kingdom . |

OTHER PUBLICATIONS

Handbuch der Schweibtechnik, Jurgen Ruge, Springer-Verlag Berlin-Heidelberg-New York 1974, No. 75 12 723.0, Deutsches Patentamt.

Primary Examiner—Kenneth J. Ramsey
Assistant Examiner—M. Jordan
Attorney, Agent, or Firm—Townsend and Townsend

[57] ABSTRACT

Workpieces 11 carrying electronic components 17 are soldered using an automatic soldering machine. In this machine the circuit boards 11 are transported between treatment stations such as a fluxing station I, a drying station II and a soldering station III. The arrangement is such that the circuit boards 11 are separated from the forwarding system 1, 2 at the treatment stations and are either held at rest during treatment or are caused to execute a movement matched to the treatment but independent of the movement of the forwarding system. In this way there is no need to specially tailor the automatic soldering machine to the particular workpiece to be soldered. Instead, a wide variety of different workpieces can be treated efficiently by one and the same soldering machine simply by coding the workpieces and by arranging the machine so that preprogrammed treatments can be carried out in dependence on the coding on the workpieces. The soldering station III is particularly advantageous, it enables a large variety of relative movements to be effected between the solder bath 12 and the workpieces 11. The geometry of the solder bath 12 can also be varied by tilting the solder discharge nozzle 13 which makes the soldering station universally adaptable to different workpieces.

12 Claims, 8 Drawing Figures

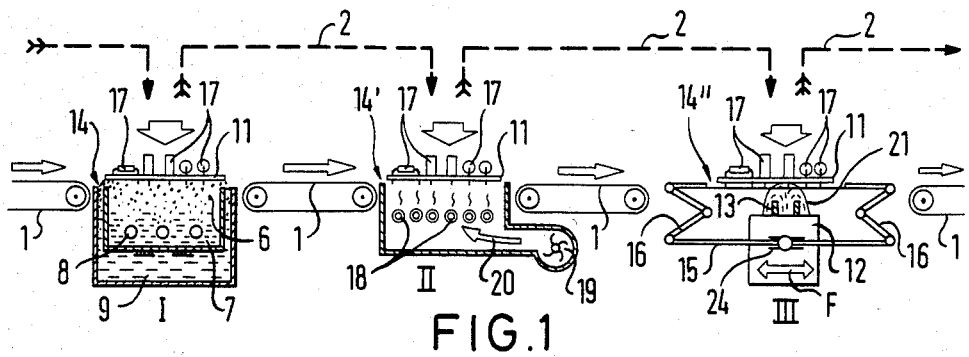
FIG.1
FIG.2
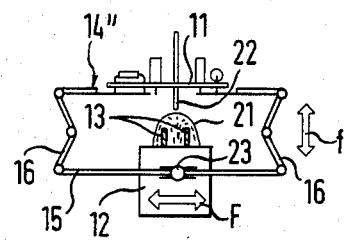
FIG.3
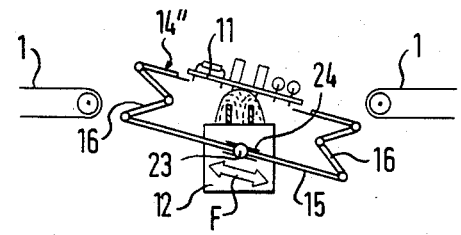
FIG.4
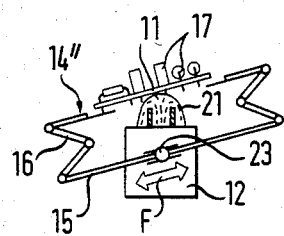
FIG.5
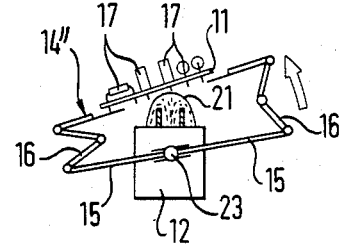
FIG.6
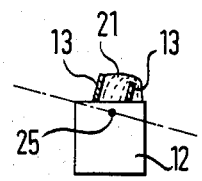
FIG.7
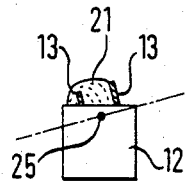
FIG.8
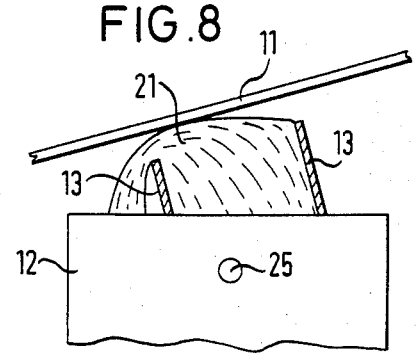

METHOD AND APPARATUS FOR THE MACHINE SOLDERING OF WORKPIECES

BACKGROUND OF THE INVENTION

The invention relates to a method and to an apparatus for the machine soldering of workpieces, in particular circuit boards or substrates carrying circuit components, wherein the workpieces are moved by means of a forwarding system one after the other to the individual treatment stations, such as a fluxing station, a drying and/or conditioning station and finally to the actual soldering station.

The workpieces involved are primarily circuit boards or substrates for electronics and for microtechnology.

When soldering circuit boards and other electronic modules the cycle of movements is normally determined by the workpiece, i.e. the workpieces are continuously subjected to an individual movement within the workpiece flow system and are guided over stationary modules of automatic soldering units where, for example, wetting with flux (fluxing), pre-drying/pre-heating and soldering take place one after the other. In known automatic soldering machines the quality of soldering depends largely on the workpiece carriers, the tolerances between the workpiece carriers and the transport system and the tolerances between the workpieces and the carriers. These tolerances originate, for example, from the thermal expansion of the circuit boards within the mounting elements in the workpiece carriers.

It is also known that the material flow within the automatic soldering units must take place at a speed which is as high as possible in the interests of high throughput.

Accordingly, in the known methods, the individual modules and conveyor lines are dimensioned to ensure that the times required for example for pre-drying and for fusing of the melt, are available at the required speed of operation. If a particular construction cannot be made larger for space or time reasons (for example in the region of the solder bath or the solder wave) it is necessary, in known devices, to match the transport speed of the whole system to these determining factors which frequently leads to uneconomical operation.

In the known soldering system it is not possible, within a production series, to change the parameters as the workpiece passes through the system because such changes can in general only be effected by changing the speed of throughput. This means that in practice only one sort of workpiece can be dealt with by an automatic soldering plant at any one time. Change-over between different workpieces can involve relatively long downtimes and inefficiency particularly with small batch production. Furthermore, in known soldering systems extended arrangements and/or waiting stations are required, which also makes the transport system station dependent (in order to transfer the required energy to the workpiece (for example thermal energy for pre-drying and for soldering) while it is passing through a particular station). The flow of energy must therefore, in some cases, take place over correspondingly long transport paths in order to act on a workpiece with the required quantity of energy during its movement through a particular station. This energy is however continuously radiated even during empty running. The quantity of energy consumed in this way reduces the degree of efficiency and the waste of energy can hardly be justified.

Practice has shown that stoppage times (cycle times) of the workpieces must be expected both when manufacturing electronic modules (for example circuit boards) manually and also inside automatic mounting machines. Previous soldering methods function anticyclically to the preceding and subsequent working steps because the soldering process takes place while the workpieces are moving. In the known methods it is therefore always necessary, having regard to the soldering process, to complete the movement of workpieces, which on its own account could be completed rapidly, within accurately defined limits for example at certain speeds by using suitably adapted workpiece carriers. In order to ensure speed compensation between the speed of the transport system and the speed of the soldering process it is necessary to use additional buffer members with corresponding control complexity.

SUMMARY OF THE INVENTION

The object of the present invention is to provide a method and an apparatus of the initially named kind in which the continuously changing tolerances which are dependent on the mounting devices are eliminated and in which the technical soldering process can be fitted cyclically into the total process cycle independently of the actual transport system.

In order to accomplish this object the invention envisages that the workpieces are separated from the forwarding system at the working stations and are either held at rest during treatment or are caused to execute a movement matched to the treatment but independent of the movement of the forwarding system.

The preferred apparatus of the invention is characterised in that the treatment stations have a workpiece mount which is either held at rest independently of the forwarding system or can execute a movement matched to the treatment but independent of the movement of the forwarding system.

Thus, in accordance with the invention, the workpiece is brought into fixed positions above the respective modules of the automatic soldering machine with the kinematics being accurately controllable by the machine itself. The workpiece now represents a clear reference plane which is stationary within the mount in the automatic machine. The workpiece can expediently be brought into the actual treatment position by a transport system and/or for example by an industrial robot or/and appropriate auxiliary devices. The transfer movement of the workpieces, which are transported without holders, can take place by means of machine internal or external handling apparatus, i.e. the named industrial robots as an alternative to band or chain-like conveyors. Magazine units can expediently be provided at the input and at the output of the machine.

When the workpiece is located above the fluxing or application station the flux can be applied within an accurately restricted period of time, within the standstill time (cycle time). For the first time it is possible to choose between the use of the overflow method, the foam fluxing method and the spray method within one and the same station. This is possible because, in contrast to known methods, the workpiece does not pass over the station during the application of flux which meant that a certain arbitrariness in the quantity and distribution of the applied flux had to be tolerated. Furthermore, the flux can be applied accurately in the desired manner to the contours of the workpiece. The workpiece once again represents a clear fixed reference plane. As the workpiece and the application station of this new arrangement represent a closed system losses (for example spray losses) and the consequent dangers (for example danger of explosion of alcohol vapors) no longer occur. As the fluxing operation can take place over the whole surface of the workpiece at the same time a considerable saving in time is achieved.

As a result of the named preconditions it is also possible to incorporate several systems (for example foam, overflow or spray) within the fluxing unit. As the selection of the required system takes place only during the standstill time of the workpiece, (for example via a corresponding code) there is no longer any need to have pauses or a specific step dependence in the sequence of workpieces as was needed with previous arrangements.

The workpieces wetted with flux mast, in known manner undergo a drying or preheating process prior to soldering in order to vaporise the solvent components of the flux to a predetermined degree so that no uncontrolled out-gassing occurs during soldering which hinders the soldering process. Pre-heating of the workpiece can also sometimes be necessary in order to shorten the subsequent soldering process (for example when soldering multiple layer circuits or to suppress strains in the material (for example with ceramic substrates)). The required temperature is normally generated on the workpiece by infrared lamps. As, in the automatic arrangement described here, the workpieces are always only in one position the infrared radiation can be accurately radiated at a relatively small surface without a large field having to be irradiated, as was previously necessary, thus resulting in a considerably reduced total radiating surface and also a reduction in the emitted power. In this way, in contrast to the known arrangement in which the lamps are permanently in operation, it is possible to use relatively inertia free infrared lamps with intermittent operation. This allows a further and considerable saving of energy. The fact that the pre-drying/pre-heating of the workpiece with the infrared lamps effectively forms a closed system means that it is possible to control the emitted infrared radiation significantly more accurately in dependence on the surface temperature of the workpiece. A fan can be added in order to drive off the solvent vapor products effectively (for example alcohol vapors) and can, if desired, be switched on intermittently.

In the automatic installation of the invention the workpiece is located during the soldering process in a mount which can be provided independently of the actual forwarding system. Each workpiece can be brought to a desired angle to, or made parallel with, the solder surface of the soldering system. The angle can also be varied during the soldering process by programmed control without having any effect on neighbouring process arrangements. In this way it is possible to adapt the process to suit differential thermal dissipation conditions and differential adhesive conditions on the workpiece. Furthermore, it is possible to match the process cycle to special features of the workpiece which require individual treatment.

The soldering system moves along the workpiece between fixed points which can be adjusted in accordance with the method. A transport dependent movement such as that of the previously known methods does not occur.

As, during this cycle, the workpiece is located in a predetermined position the soldering process can be adapted to suit the individual conditions of the workpiece surface which is to be soldered for example by changing the speed of the soldering system and/or by other characteristic movements of the soldering system, for example also in the vertical direction. Moreover, a simultaneous change of the parameters of the movement is possible, for example change of the speed of travel of the system with simultaneous angle adjustment or simultaneous vertical movement in order to carry out soldering tasks, for example on plug pins and/or sectors of a circuit board with otherwise normal soldering requirements.

The initial soldering conditions obtained by use of a guide or template which can be changed by program control, and which can also be obtained by changing the flow direction of the solder either to both sides or selectively in only one direction, makes it possible to solder sections (sectors) of the workpiece surface immediately after the soldering of whole surfaces. The ability to combine these methods means the advantages of the previously separately used methods (bath and wave soldering) can be utilised within the system.

The changing of the flow direction of the solder by changing the solder outlet direction further ensures that the method is not directionally restricted by the direction of movement relative to the workpiece. Accordingly, there is no need for return travel into the zero position. There are therefore no return strokes.

The fact that the workpiece is stationary or located in a fixed position during treatment means that cooling of the solder takes place in a state of rest. This is particularly advantageous for high quality soldering tasks, for example in microtechnology, where each movement can detract from the quality, even if only a low degree of vibration occurs. The soldered connection can thus solidify free of vibration without the crystalline structure being disturbed by mechanical influences. The same applies to soldered joints with modules having very large thermal capacities. In this case the method cycle allows the workpiece to remain at rest until solidification of the solder has taken place. In addition, cooling can be added to the cycle via the program without affecting workpieces located before or after the soldering process.

The fact that the mount operates completely independently of the particular transport system means that the actual movement and angular positioning of the workpiece, if this appears necessary for the soldering process, does not have any effect on the transport system. The workpiece mount always returns at the end of the particular treatment back to the zero position. In this manner, even with extreme angular positions during the soldering process, the troublesome vertical differences between the inlet and the outlet of the particular working station are avoided.

The guide for the solder bath can follow the pivotal movements of the workpiece or can also execute pivotal movements independent therefrom. The pivotal movements of the solder outlet nozzle make partial soldering using different and optimised soldering methods possible. The tilting of the workpiece before and/or during the soldering process ensures an ideal solder run-off angle.

The advantage of the method of the invention lies primarily in the fact that the workpiece is brought into a fixed working position predetermined by the automatic machine independently of a specific transport system. In this way the defined individual movements of the automatic machine, and the combination of the various individual movements, is intended to make it possible to carry out soldering tasks when soldering and tinning electronic components which were previously not possible. In previous methods soldering of the workpiece was fundamentally always carried out in dependence on a quite specific transport system during the transport movement of the workpieces. Movements deviating from the movement of the transport system were then only possible with additional auxiliary devices.

The coding of the workpiece can be freely selected in just the same way as the type of forwarding system. For the first time the method of the invention leaves the choice open as to whether the workpiece will be forwarded within the selected transport system in a workpiece carrier or whether the workpiece will be directly handled, for example by the aforementioned industrial robot. The coding can for example take place by screen printing which is customary with circuit boards to specify the components on the mounting side, and the printed code can then be read, for example as a bar code, by an electronic reading apparatus in order to select the necessary parameters in the automatic machine.

The invention will now be described by way of example only and with reference to the drawings which show:

BRIEF DESCRIPTION OF THE DRAWINGS

FIG. 1 a schematic side view of an automatic soldering apparatus in accordance with the invention to illustrate the method of the invention for machine soldering of circuit boards carrying circuit components, FIG. 2 an individual view of the soldering station shown in FIG. 1 with the soldering bath 12 in a different vertical position, FIG. 3 the soldering station of FIG. 1 with the workpiece mount tilted relative to the soldering bath, FIG. 4 the soldering station of FIG. 3 tilted in the opposite direction, FIG. 5 the soldering station of FIG. 4 with the workpiece mount being additionally inclined relative to the solder bath, FIG. 6 a schematic side view of the soldering bath with the solder outlet nozzle tilted to the right, FIG. 7 a schematic side view of the soldering bath with the solder outlet nozzle tilted to the left, and FIG. 8 an enlarged view of the solder bath of FIG. 7 which also shows the workpiece.

DESCRIPTION OF PREFERRED EMBODIMENTS

As shown in the drawing the workpieces are formed by circuit boards 11 which are equipped with electronic components 17. As seen in FIG. 1 the circuit boards 11 together with the electronic components 17 which are to be soldered and which are mounted thereon are forwarded via a forwarding system 1, 2 to the individual treatment stations I, II and III. The forwarding system consists of conveyor bands 1 which each lead to a workpiece mount 14, 14' and 14" respectively. In accordance with the invention the workpieces are lifted from the conveyor band 1 before reaching one of the workpiece mounts 14, 14', 14" and are placed onto the workpiece mounts 14, 14', 14" which are separate from the forwarding system. The lifting of the workpieces 11 from the conveyor band 1 and their placement in a position independent from the forwarding system is illustrated by broken lines 2 in FIG. 1.

The movements of the transport band 1 and of the lifting and transfer devices 2 are matched solely to the requirements for troublefree and ideal transport of the workpieces 11 from one station to the next. Control parameters during this transport cycle need only be considered for buffering purposes or with regard to the effect of acceleration processes on loosely inserted components.

In the first treatment station I the circuit board 11 lies on a workpiece mount 14 at which there is arranged a pure submersion fluxing device 6 in combination with a foam fluxing device 7 or a spray fluxing device 8 which operates either mechanically or with ultrasonic excitation. The quantity of flux in the upper vessel can be matched to the operating condition required in any particular case by pumping it into a compensation vessel 9.

It is important that the circuit board 11 remains stationary after it has been transferred onto the workpiece mount 14 so that the fluxing station 1 can be changed-over to various operating methods within a common system.

After wetting with flux in the fluxing station I the workpiece is transferred by lifting onto the continuation of the transport band 1 and is transferred to the pre-drying/pre-warming station II where the workpiece 11 is once again lifted from the transport band 1 and placed onto a stationary workpiece mount 14'. Heating elements 18 are arrangd beneath the workpiece mount 14'. A fan 19 can generate an air stream indicated by the arrow 20 which, after heating by means of the heating elements 18, flows over the circuit board 11 lying on the workpiece mount 14' and completes the pre-drying or pre-warming process. This process also takes place with the circuit board 11 and the electronic components 17 arranged thereon remaining completely stationary.

In the next step the circuit board 11 is once again lifted from the workpiece mount 14' and is conveyed by the further continuation of the transport band 1 to the soldering station 3 where the circuit board 11 is now deposited on a workpiece mount 14" which can be moved independently of the forwarding system 1, 2 in a manner which has yet to be described. The solder bath 12, from which the wave 21 of solder emerges at the top through a solder outlet nozzle 13, is located beneath the workpiece 14" at the soldering station III so as to act on the circuit board 11 from below.

The solder bath 12 is displaceably suspended in the direction of the double arrow F beneath the workpiece mount 14 on one of two rails 15 which extend substantially horizontally.

Futhermore, the rails 15 are vertically adjustably suspended at their ends via link arm pairs 16 relative to the workpiece mount 14". In this manner a change in the vertical position of the solder bath 12 can be effected by greater or lesser extension or folding of the link arm pairs 16. Whereas the solder bath 12 has been moved so close to the circuit board 11 at the soldering station 3 of FIG. 1 that the wave of solder 21 reaches the lower surface of the circuit board 11 the solder bath 12 is moved sufficiently far downwardly in FIG. 1, by extension of the link arm pairs 16, that a component 22 which projects downwardly beyond the circuit board 11 comes into contact with the crest of the solder wave 21 while the solder wave 21 no longer contacts the lower side of the circuit board 11.

After soldering the joint at the component 22 the solder bath 22 can once again be displaced in the horizontal direction in accordance with the double arrow F whereupon it can be lifted again by renewed folding of the link arm pairs 16 so that the cost of the solder wave 21 reaches the lower side of the circuit board 11. In other words it is possible to travel along any desired contour or path along the lower side of the circuit board 11, so that ideal soldering is possible, by combined displacement of the solder bath 12 along the direction specified by the double arrow F and by controlled lifting or lowering of rails 15 in the sense of the double arrow f. In this manner pure submersion tinning can be coupled with the soldering process. In the same manner selective soldering by point application of solder is also possible.

FIG. 3 shows that it is also possible to pivot the workpiece mount 14" about a transverse axis 23 together with the rails 15 suspended therefrom via the link arm pairs 16. The transverse axis 23 lies horizontal and at right angles to the forwarding direction. Optimum solder run-off angles can be achieved by suitable pivoting of the workpiece 11 about the transverse axis 23. As can be seen from FIG. 3 the guide 24 for the solder bath provided on the rails 15 follows the pivotal movements so that, with a displacement of the solder bath 12 in the direction of the double arrow F, a parallel displacement relative to the circuit board 11 is ensured.

As seen in FIG. 4 the workpiece mount with the elements arranged thereon is tilted about the transverse axis 23 in the sense directly opposite to that of FIG. 3. As a result of the oppositely disposed tilt of the workpiece 11 it is possible to carry out treatment during a horizontal movement of the solder bath 12 in both directions. As a consequence the solder system need no longer be returned to a zero position.

It is important that the plane of the transport band 1 remains uninfluenced by any form of pivotal movement, even by large changes of angle required for the treatment.

FIG. 5 shows how additional tilting of the plane of the workpiece mount 14" can be effected by differential folding of the two link arm pairs 16. By extending the right hand link arm pair 16 rather more than the left it is possible to effect further tilting of the workpiece mount 14" without pivotal movement about the transverse axis 23. This is expedient, by way of example, when the speed of flow of the solder, or the contact time of the liquid solder with the surface of the workpiece is to be changed as a result of different adhesive conditions or as a result of different conditions of thermal dissipation or thermal capacity.

Attention should also be drawn to the fact that all movements that are illustrated in FIGS. 1 to 5 can be previously programmed so that they take place in accordance with a predetermined program plan.

As seen in FIGS. 6 to 8 the solder outlet nozzle 13 can also be pivoted about a transverse axis 25 relative to the solder bath 12. This adjustment can also take place automatically by programming. In this way the solder can move past the edge of the solder outlet nozzle 13 either to the right (FIG. 6) or to left (FIGS. 7,8) or to both sides (FIGS. 1 to 5). In this way an ideal solder cycle can be ensured in both horizontal directions of travel of the solder bath 12 with constant, i.e. reproducible conditions.

What is claimed is:
1. A method for the automatic machine soldering of workpieces in an apparatus having a plurality of treatment stations including at least a fluxing station, a heating station and a soldering station, and means for transferring said workpieces from one of said treatment stations to an adjacent one of said treatment stations, the method comprising the steps of:
   (a) transferring a said workpiece into a first fixed position above said fluxing station;
   (b) fluxing while holding said workpiece independent of any movement of said transferring means;
   (c) transferring said workpiece from a second fixed position above said fluxing station to a third fixed position above said heating station;
   (d) heating said workpiece independent of any movement of said transferring means;
   (e) transferring said workpiece from a fourth fixed position above said heating station to a fifth fixed position above said soldering station;
   (f) soldering said workpiece while pivoting said workpiece about a substantially horizontal axis to produce relative movement between said workpiece and a crest of a solder wave, said crest of said solderf wave being moved relative to said workpiece along a lower surface thereof, said solder step being independent of any movement of said workpiece during said transferring steps.

2. A method in accordance with claim 1 wherein the speed of movement of said crest of said solder wave along said lower surface of said workpiece is changed so as to compensate for at least one of differential thermal dissipation and thermal capacity along the lower surfaces of said workpiece.

3. The method of claim 1 wherein said fluxing step (b) and said heating step (d) are carried out while said workpiece is stationary.

4. Apparatus for the machine soldering of workpieces in the form of electronic circuits, each said workpiece having a lower side, the apparatus comprising:
   at least a fluxing station for effecting a fluxing treatment on said workpieces, a heating station for effecting a heating treatment on said workpieces, and a soldering station for effecting a soldering treatment on said workpieces;
   a fluxing mount for holding said workpieces in said fluxing station;
   means defining a fixed position of said fluxing mount in said fluxing station;
   a heating mount for holding said workpieces in said heating station;
   means defining a fixed position of said heating mount in said heating station;
   a soldering mount for holding said workpieces in said soldering station;
   means defining a fixed position of said soldering mount in said soldering station;
   first forwarding means for moving said workpieces from said fluxing mount to said heating mount and second forwarding means for moving said workpieces from said heating mount to said soldering mount;
   means in said fluxing station for selectively effecting fluxing of a workpiece held in said fluxing mount by one of a plurality of fluxing methods;
   means in said heating station for effecting heating of a workpiece held in said heating mount by at least one heating method;

wherein said soldering station comprises a solder bath, means for generating a solder wave with a crest having a surface, means for effecting relative movement between said soldering mount and said crest of said solder wave so that said crest travels along a desired path along a lower side of a workpiece held in said soldering mount;

means for varying the angle between said surface of said crest and said lower side of said workpiece; and wherein any treatment dependent movement of said workpiece in any of said stations is carried out solely in accordance with the respectively associated treatment but independently of said first and second forwarding means.

5. Apparatus in accordance with claim 4 wherein said heating station comprises combined heating means for effecting heating by one of a plurality of heating methods.

6. Apparatus in accordance with claim 4 further comprising means for generating a solder wave with a crest having a surface, said solder wave generating means including a solder outlet nozzle, and wherein means are provided for pivoting said solder outlet nozzle about a transverse axis relative to said solder bath to produce movement of said solder crest.

7. Apparatus in accordance with claim 4 wherein said means for producing relative movement between said crest and said soldering mount comprises a parallelogram system provided on each side of said solder bath, each said parallelogram system comprising a rail having opposite ends and extending alongside said solder bath, and first and second pairs of pivotally connected links respectively disposed between opposite ends of said rail and said workpiece mount, wherein the rail on one side of the solder bath is parallel to the rail on the opposite side thereof; the apparatus further comprising means for mounting said solder bath for movement along said parallel rails, means for tilting said parallel rails selective to said solder bath; and means for folding said pairs of pivoted links whereby to vary the positioning of said soldering mount relative to said solder bath.

8. The apparatus of claim 4 wherein said heating means includes a heating element and a fan for blowing air across the heating element and against said lower side of said workpieces.

9. Apparatus for the machine soldering of workpieces, the apparatus comprising a plurality of treatment stations including at a fluxing station, a heating station and a soldering station; respective workpiece mounts in each of said stations for holding said workpieces during the respective treatments in said treatment stations; a plurality of transfer means each adapted to transfer a said workpiece from a said workpiece mount in a fixed position in one of said treatment stations into a further one of said workpiece mounts in a fixed position in the next adjacent treatment station; respective means associated with each of said workpiece mounts for holding the respective workpiece mount stationary during treatment thereof, and respective means for selectively passing each said workpiece mount to execute a treatment dependent movement independent of any movement of said plurality of forwarding systems.

10. Apparatus for the machine soldering of workpieces, the apparatus comprising:
a fluxing station for effecting a fluxing treatment on said workpieces;
a heating station for effecting a heating treatment on said workpieces;
a soldering station for effecting a soldering treatment on said workpieces;
a fluxing mount for holding said workpieces in said fluxing station;
a heating mount for holding said workpieces in said heating station;
a soldering mount for holding said workpieces in said soldering station;
first forwarding means for moving said workpieces from said fluxing mount to said heating mount and second forwarding means for moving said workpieces from said heating mount to aid soldering mount;
said soldering station comprising a solder bath for generating a solder wave having a crest;
means for moving said crest relative to said soldering mount to effect soldering;
said solder bath including a solder outlet nozzle for generating said solder wave and said solder crest;
means for pivoting said solder outlet nozzle about a transverse axis relative to said solder bath to produce movement of said solder crest;
wherein each of said fluxing mount, said heating mount and said soldering mount are moved solely in accordance with the respectively associated treatment but independently of said first and second forwarding means.

11. Apparatus for the machine soldering of workpieces, the apparatus comprising:
a fluxing station for effecting a fluxing treatment on said workpieces;
a heating station for effecting a heating treatment on said workpieces;
a soldering station for effecting a soldering treatment on said workpieces;
a fluxing mount for holding said workpieces in said fluxing station;
a heating mount for holding said workpieces in said heating station;
a soldering mount for holding said workpieces in said soldering station;
first forwarding means for moving said workpieces from said fluxing mount to said heating mount and second forwarding means for moving said workpieces from said heating mount to said soldering mount;
said soldering station comprising a solder bath for generating a solder wave having a crest;
means for moving said crest relative to said soldering mount to effect soldering;
said relative moving means including a parallelogram system on each side of said solder bath, each said parallelogram system comprising:
a rail having opposite ends and extending alongside said solder bath;
first and second pairs of pivotally connected links respectively disposed between opposite ends of said rail and said workpiece mount, wherein the rail on one side of said solder bath is parallel to the rail on the opposite side thereof;
means for mounting said solder bath for movement along said parallel rails;
means for tilting said parallel rails relative to said solder bath; and means for holding said pairs of pivoted links to vary the positioning of said soldering mount relative to said solder bath; and wherein each of said fluxing mount, said heating mount and said soldering mount are moved solely in accordance with the respectively associated treatment but independently of said first and second forwarding means.

12. The apparatus of claim 11 wherein said pivot links folding means folds said pair of links independently to vary the angle of said soldering mount relative to said solder bath.

* * * * *